US011750983B2

(12) United States Patent
Lim et al.

(10) Patent No.: US 11,750,983 B2
(45) Date of Patent: Sep. 5, 2023

(54) MICROPHONE ASSEMBLY WITH STANDOFFS FOR DIE BONDING

(71) Applicant: Knowles Electronics, LLC, Itasca, IL (US)

(72) Inventors: Tony K. Lim, Naperville, IL (US); Norman Dennis Talag, Woodridge, IL (US)

(73) Assignee: Knowles Electronics, LLC, Itasca, IL (US)

( * ) Notice: Subject to any disclaimer, the term of this patent is extended or adjusted under 35 U.S.C. 154(b) by 191 days.

(21) Appl. No.: 17/288,502

(22) PCT Filed: Oct. 24, 2019

(86) PCT No.: PCT/US2019/057820
§ 371 (c)(1),
(2) Date: Apr. 23, 2021

(87) PCT Pub. No.: WO2020/086819
PCT Pub. Date: Apr. 30, 2020

(65) Prior Publication Data
US 2021/0392442 A1      Dec. 16, 2021

Related U.S. Application Data

(60) Provisional application No. 62/751,143, filed on Oct. 26, 2018.

(51) Int. Cl.
*H04R 19/04* (2006.01)
*B81B 7/00* (2006.01)
*H04R 1/04* (2006.01)
*H04R 31/00* (2006.01)
*H04R 19/00* (2006.01)

(52) U.S. Cl.
CPC ............ *H04R 19/04* (2013.01); *B81B 7/0006* (2013.01); *H04R 1/04* (2013.01); *H04R 31/006* (2013.01); *B81B 2201/0257* (2013.01); *H04R 19/005* (2013.01)

(58) Field of Classification Search
CPC ........ H04R 19/04; H04R 1/04; H04R 31/006; H04R 19/005; B81B 7/0006; B81B 2201/0257
See application file for complete search history.

(56) References Cited

U.S. PATENT DOCUMENTS

| 9,420,378 | B1 * | 8/2016 | Syed ...................... H04R 19/04 |
| 2014/0044297 | A1 * | 2/2014 | Loeppert ................ H04R 1/086 381/355 |
| 2018/0148323 | A1 * | 5/2018 | Ghidoni .............. B81C 1/00182 |

* cited by examiner

*Primary Examiner* — Sunita Joshi
(74) *Attorney, Agent, or Firm* — Loppnow & Chapa; Matthew C. Loppnow

(57) ABSTRACT

A microphone assembly includes a substrate and a microelectromechanical systems (MEMS) die. The substrate comprises a top layer and a bottom layer. The top layer comprises a layer of solder mask material spanning across at least a portion of the substrate and one or more standoffs formed of the solder mask material. The one or more standoffs and the layer of solder mask material comprising a single, contiguous structure. The MEMS die is disposed on the one or more standoffs and is coupled to the substrate via a bonding material. The bonding material forms an acoustic seal between the substrate and the MEMS die.

20 Claims, 12 Drawing Sheets

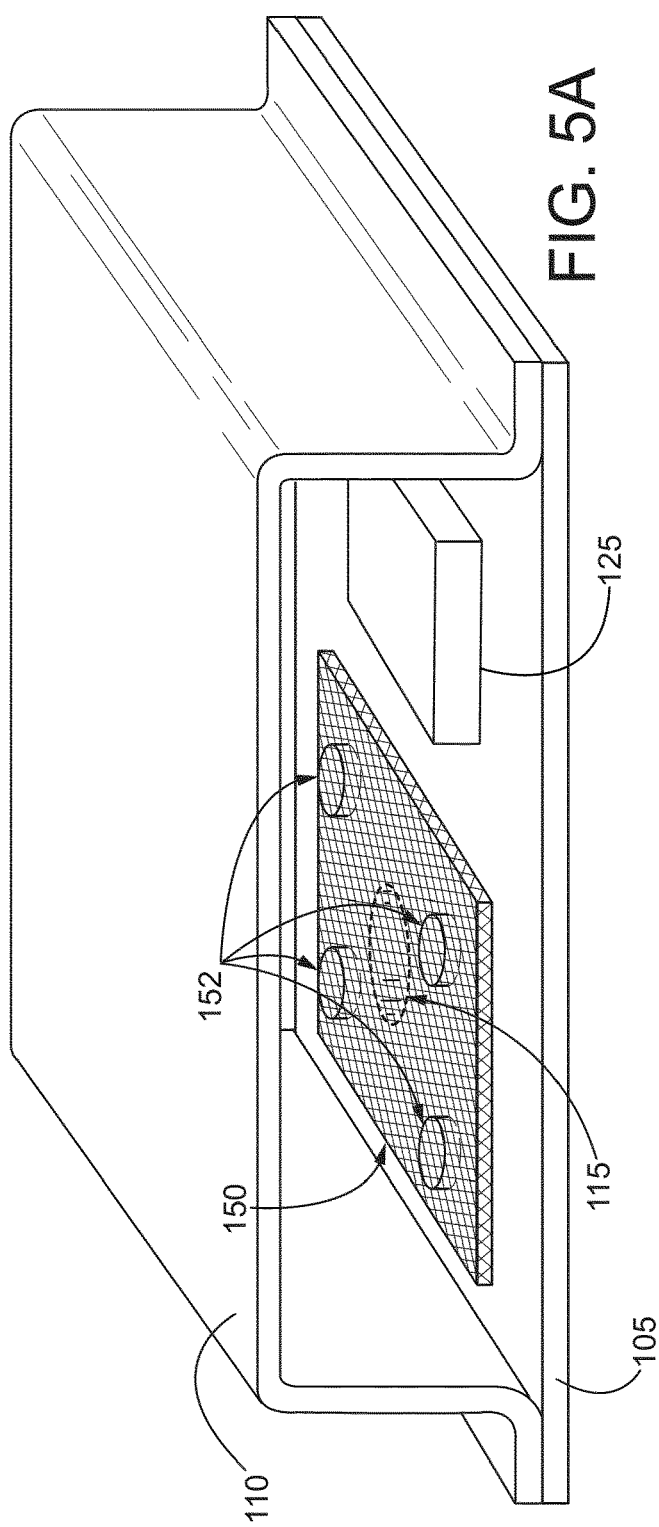
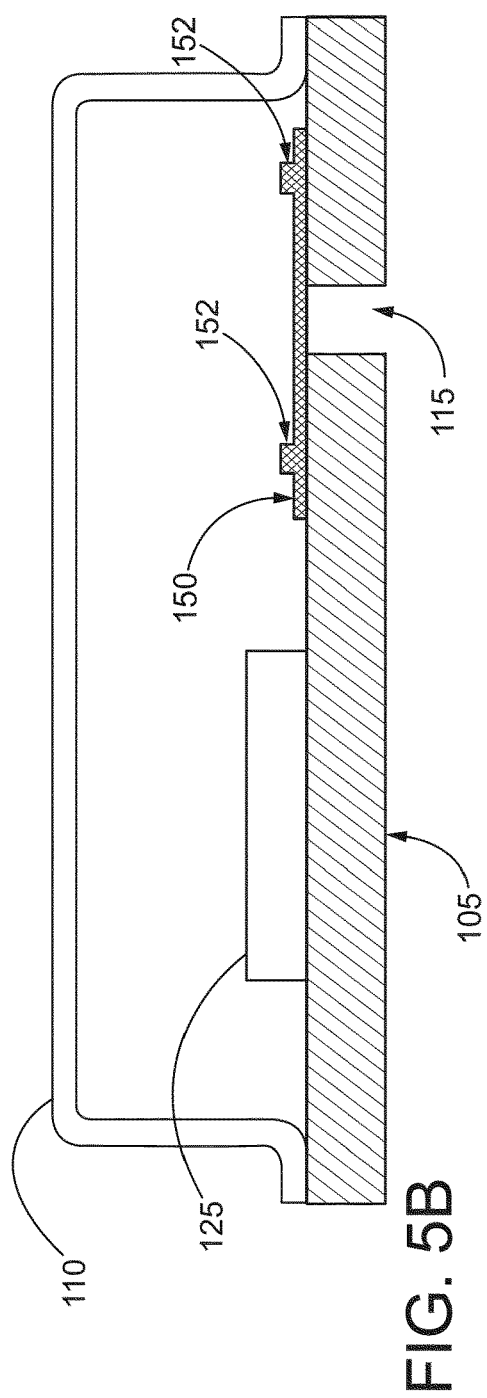

MICROPHONE ASSEMBLY WITH STANDOFFS FOR DIE BONDING

CROSS-REFERENCE TO RELATED PATENT APPLICATION

This application claims the benefit of and priority to U.S. Provisional Patent Application No. 62/751,143 filed Oct. 26, 2018, the entire contents of which is incorporated by reference herein.

BACKGROUND

In a microelectromechanical system (MEMS) microphone a MEMS die includes at least one diaphragm and at least one back plate. The MEMS die is supported by a substrate and enclosed by a housing (e.g., a cup or cover with walls). A port may extend through the substrate (for a bottom port device) or through the top of the housing (for a top port device). Sound energy traverses through the port, moves the diaphragm, and creates a changing electrical potential of the back plate, which creates an electrical signal. MEMS microphones are deployed in various types of devices such as personal computers, cellular phones, mobile devices, headsets, and hearing aid devices.

SUMMARY

One aspect of the present disclosure is a microphone assembly. The microphone assembly includes a substrate and a MEMS die coupled to the substrate. The substrate includes a top layer and a bottom layer. The top layer includes a layer of solder mask material spanning across at least a portion of the substrate and one or more standoffs formed of the solder mask material. The one or more standoffs and the layer of solder mask material comprise a single, contiguous structure. The MEMS die is disposed on the one or more standoffs and is coupled to the substrate via a bonding material. The bonding material forms an acoustic seal between the substrate and the MEMS die.

Another aspect of the present disclosure is a microphone assembly. The microphone assembly includes a substrate, a cover, an acoustic port, an ingress protection element, and a MEMS die. The substrate comprises a top surface and a bottom surface and the cover is coupled to the top surface of the substrate. The acoustic port is formed in the substrate. The ingress protection element comprises a top surface and a bottom surface. The bottom surface of the ingress protection element is coupled to the top surface of the substrate and spans across the acoustic port. The top surface of the ingress protection element comprises one or more standoffs. The one or more standoffs and the ingress protection element comprise a single, contiguous structure. The MEMS die is disposed on the one or more standoffs and is coupled to the ingress protection element via a bonding material. The bonding material forms an acoustic seal between the ingress protection element and the MEMS die.

Yet another aspect of the present disclosure is a microphone assembly. The microphone assembly includes a substrate, a cover, an acoustic port, and a MEMS die. The substrate comprises a top layer and a bottom layer. The top layer comprises a layer of solder mask material that spans across at least a portion of the substrate and at least three standoffs formed of the solder mask material. The at least three standoffs and the layer of solder mask material comprise a single, contiguous structure. The cover is coupled to the top layer of the substrate and the acoustic port is formed in the substrate or is formed in the cover. The MEMS die is disposed on the one or more standoffs and is coupled to the substrate via a bonding material. The bonding material forms an acoustic seal between the substrate and the MEMS die.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

FIG. 5A shows a top view of an ingress protection element disposed on a top surface of a substrate of a microphone assembly and comprising standoffs formed of ingress protection material, according to some embodiments.

FIG. 5B shows a side view of an ingress protection element disposed on a top surface of a substrate of a microphone assembly and comprising standoffs formed of ingress protection material, according to some embodiments.

Figure 1A:
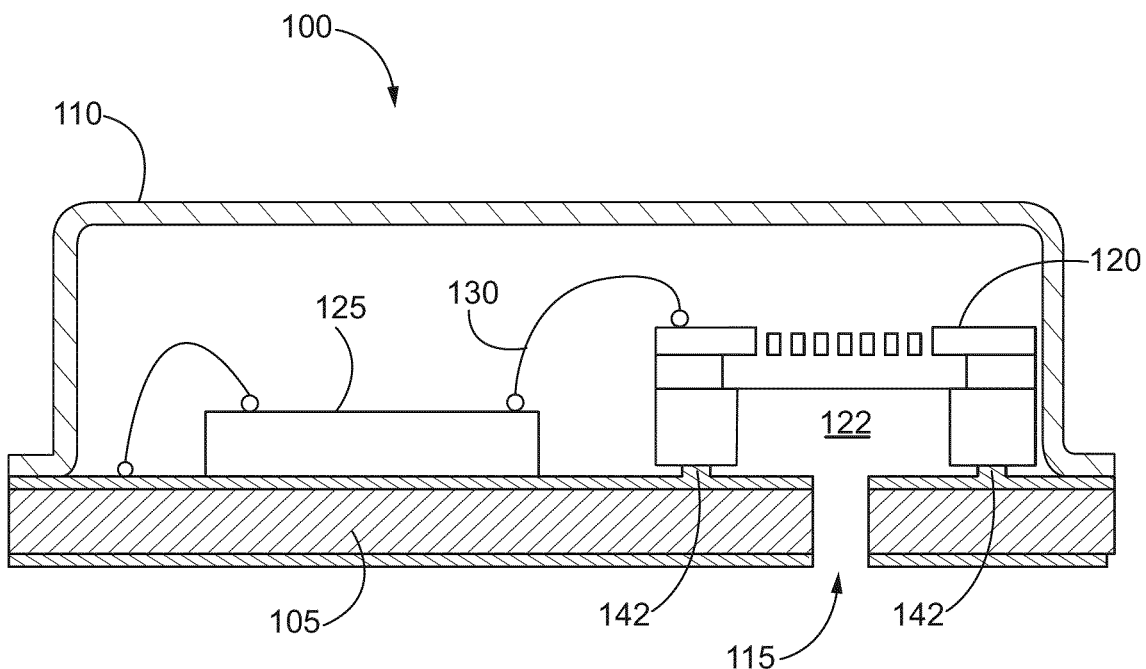
FIG. 1A shows a cross-sectional view of a bottom port microphone assembly comprising a substrate with solder mask standoffs for bonding a MEMS die, according to some embodiments.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, and designed in a wide variety of different configurations, all of which are explicitly contemplated and make part of this disclosure.

DETAILED DESCRIPTION

Referring generally to the FIGURES, a microphone assembly with standoffs for die bonding is shown, according to various embodiments. The standoffs provide support for a MEMS microphone die and facilitate the formation of a thicker and more consistent bond line between the MEMS die and a substrate or an ingress protection element of a microphone assembly. Without standoffs, the MEMS die can sink into the bonding material, thereby resulting in a thin (e.g., 5 μm) and inconsistent bond line. In some embodiments, the standoffs are formed (e.g., of solder mask material) as part of a top layer of the substrate of a microphone assembly. In other embodiments, the standoffs are formed as part of an ingress protection element (e.g., polyimide mesh) of a microphone assembly. The strong and even bond facilitated by the standoffs provides one or more of several advantages including improved sensitivity and performance, improved durability, and improved ease of fabrication.

Figure 1B:
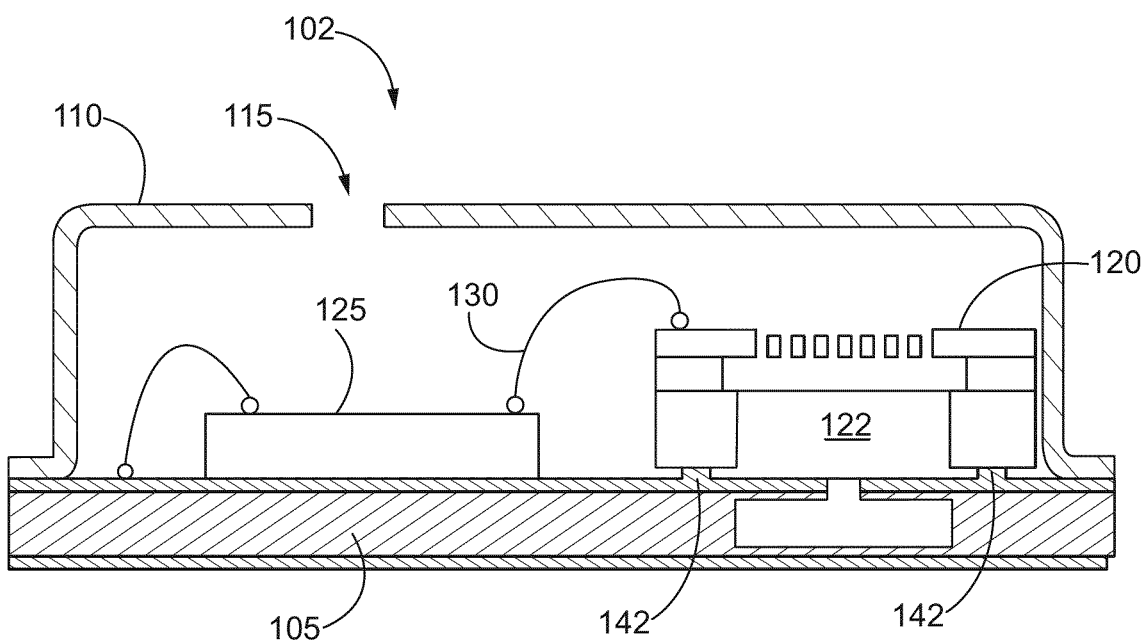
FIG. 1B shows a cross-sectional view of a top port microphone assembly comprising a substrate with solder mask standoffs for bonding a MEMS die, according to some embodiments.
Figure 2:
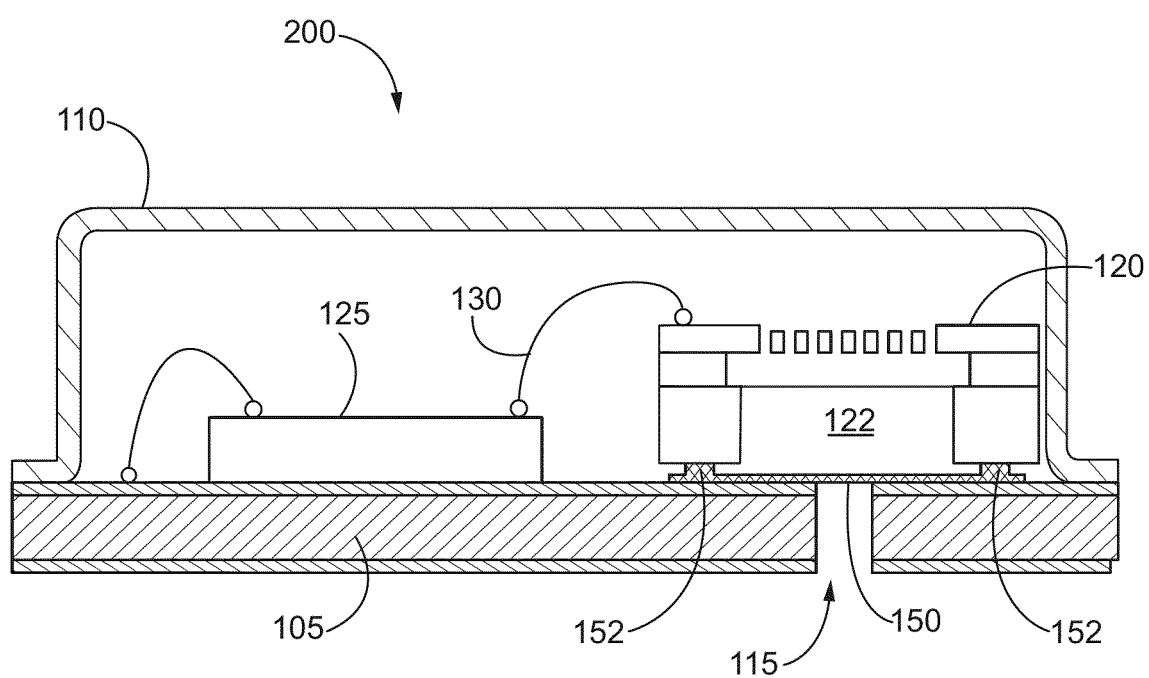
FIG. 2 shows a cross-sectional view of a bottom port microphone assembly with an ingress protection element disposed over the port and comprising standoffs for bonding a MEMS die, according to some embodiments.

Turning now to FIGS. 1A-1B and FIG. 2, three example implementations of a microphone assembly are shown, according to various embodiments. The microphone assemblies shown can be surface-mount components for use with a variety of electronic devices such as smart phones, laptops, tablets, and digital cameras. Each of the microphone assemblies shown includes a MEMS transducer configured to convert acoustic energy (e.g., sound, voice, etc.) into an electrical output and an integrated circuit configured to process electrical signals output by the transducer. The configurations shown are intended to be exemplary and variations thereof are contemplated within the scope of the present disclosure. For example, the MEMS transducer could be a dual motor transducer, the integrated circuit could be embedded in the substrate, and one more sensors (e.g., pressure sensors, temperature sensors, etc.) could be included in various configurations not shown in FIGS. 1A-1B and FIG. 2.

Referring specifically to FIG. 1A, a microphone 100 is shown according to an example embodiment. Microphone 100 is shown to include a substrate 105 (e.g., base, printed circuit board) on which a MEMS die 120 and an integrated circuit 125 (e.g., an application specific integrated circuit, or ASIC) are mounted. Substrate 105 can include any number of insulating layers, metal layers, and connection pads/paths. For example, processed audio signals can be provided to a host device (e.g., smart phone, laptop) via one or more connection pads on the bottom of substrate 105. MEMS die 120 can be constructed of silicon and can include a fixed backplate with ventilation holes and a movable diaphragm. MEMS die 120 can also include a constrained or partially constrained diaphragm, a freeplate diaphragm, or various combinations thereof. MEMS die 120 can be a capacitive transducer in which acoustic signals enter a front volume 122 (e.g., pressure reference) of MEMS die 120 and cause the diaphragm to move, creating a change in capacitance between the diaphragm and the backplate. MEMS die 120 can be electrically connected to integrated circuit 125 via wire bonds 130. Electrical signals representative of the change in capacitance generated by MEMS die 120 can be sent to integrated circuit 125 for processing. For example, processing via integrated circuit 125 can include filtering, buffering, amplification, analog-to-digital conversion, digital-to-analog conversion, quantization, decimation, phase shifting, etc. Integrated circuit 125 receives the signals from the MEMS die 120 and generates output signals/data representative of the sensed acoustic activity. Microphone 100 is also shown to include a cover 110 that is coupled to substrate 105. As a result, substrate 105 and cover 110 form a housing or packaging that encloses and protects MEMS die 120 and integrated circuit 125. In some embodiments, cover 110 is made of a metal material that provides radio-frequency protection and other noise cancellation capabilities.

Microphone 100 is an example of a bottom port configuration. As shown, sound energy travels through an acoustic port 115 that is formed in substrate 105. MEMS die 120 is bonded to substrate 105 and is disposed over port 115. The acoustic energy enters the microphone housing through port 115 and MEMS die 120 accordingly generates an electrical signal. FIG. 1B shows an example of a top port microphone 102 where acoustic port 115 is formed in cover 110 instead of substrate 105. In addition, a cavity 118 can be formed in substrate 105 in order to extend volume 122 and increase the sensitivity of microphone 102. In some embodiments, cover 110 is formed of a second substrate that is attached to substrate 105. In such embodiments, acoustic port 115 is formed in this substrate lid and MEMS die 120 is attached to the substrate lid and disposed over the port.

As shown in FIGS. 1A-1B, MEMS die 120 is supported by standoffs 142 that are formed into substrate 105 and form a single, contiguous structure with substrate 105. In some embodiments, standoffs 142 are formed of solder mask material and are part of a top layer of substrate 105. Standoffs 142 provide support for MEMS die 120 during the die bonding process and facilitate the formation of a strong and even bond between MEMS die 120 and substrate 105. Standoffs 142 can also be formed into a substrate cover 110 as described above to achieve similar results.

Referring now to FIG. 2, another microphone 200 is shown according to an example embodiment. Microphone 200 is another example of a bottom port configuration, however microphone 200 includes an ingress protection element 150 that is disposed over acoustic port 115. Ingress protection element 150 is acoustically permeable but obstructs contaminants from entering the microphone housing. Ingress protection element 150 can include any materials (e.g., mesh, film, membrane, porous, nonporous) that prevent the ingress of contaminants into the housing. In some embodiments, ingress protection element 150 is a polyimide mesh material that is spin coated onto substrate 105 and patterned into a mesh material using a photolithographic process. As shown in FIG. 2, ingress protection element 150 is disposed on a top surface of substrate 105 and spans across port 115. In other embodiments, ingress protection element 150 may be disposed over a port formed in cover 110, may be embedded in substrate 105, or may be disposed on a bottom surface of substrate 105 (in some such embodiments, standoffs 142 may be formed in substrate 105 instead of ingress protection element 150). In the case of microphone 200, MEMS die 120 can be bonded to ingress protection element 150 instead of substrate 105.

As shown in FIG. 2, MEMS die 120 is supported by standoffs 152 that are formed into ingress protection element 150 and form a single, contiguous structure with ingress protection element 150. In some embodiments, standoffs 152 are formed of a polyimide mesh material and are patterned into ingress protection element 150 during a photolithographic process. Standoffs 152 provide support for MEMS die 120 during the die bonding process and facilitate the formation of a strong and even bond between MEMS die 120 and ingress protection element 150.

Figure 3A:
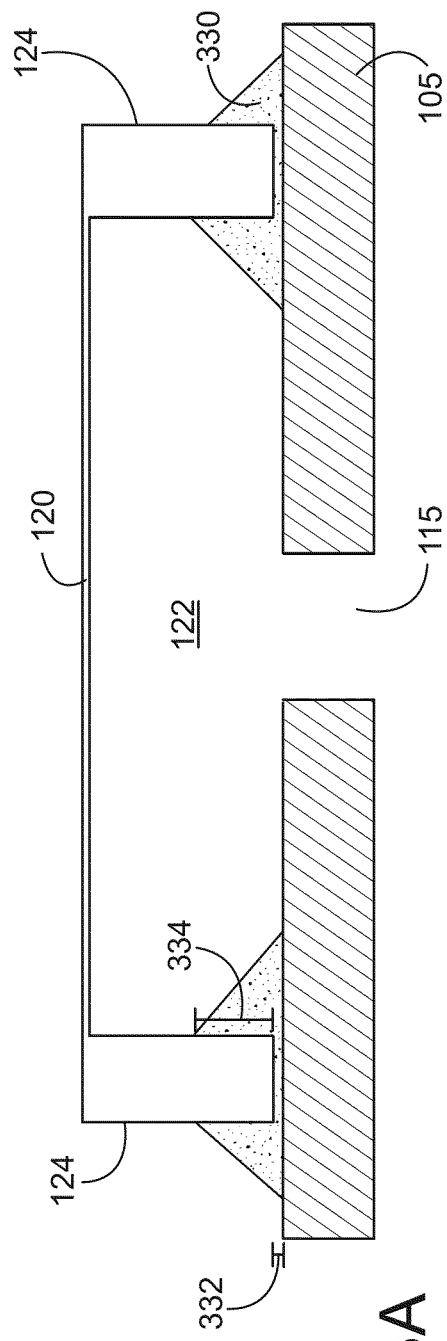
FIG. 3A shows a front view of a MEMS die bonded to a substrate of a microphone assembly without standoffs, according to some embodiments.

Turning now to FIG. 3A, a drawing of MEMS die 120 when bonded to substrate 105 via bonding material 330 without standoffs is shown, according to some embodiments. Bonding material 330 can be any kind of die attach material (e.g., soluble/insoluble, organic/inorganic, hard/soft, adhesive, glue, epoxy, SU-8, benzocyclobutene, etc.) used to bond MEMS die 120 to a microphone assembly. In some embodiments, bonding material 330 forms an acoustic seal between substrate 105 and MEMS die 120 or ingress protection element 150 and MEMS die 120. As shown in FIG. 3A, cavity 122 is formed in MEMS die 120 such that cavity 122 serves as a front volume or back volume in a microphone assembly (a front volume in the case of the bottom port embodiments shown in FIGS. 1-2). In some embodiments, cavity 122 is formed in MEMS die 120 using a dry or wet etching process. As a result, MEMS die 120 includes legs 124 (e.g., 150-200 µm wide) that remain after cavity 122 is formed in MEMS die 120. Accordingly, the surface area of the portion of MEMS die 120 that is bonded to substrate 105 is reduced, and the force exerted on bonding material 330 is increased at the point of contact. With a die that has a simple rectangular geometry such as integrated circuit 125, a much larger surface area of the die is bonded to substrate 105 and the force exerted on bonding material 330 is more evenly distributed.

As shown in FIG. 3A, legs 124 sink into bonding material 330 during fabrication of the microphone assembly (e.g., during surface curing). This sinking effect can be especially significant when a "soft" die attach material such as a soft epoxy is used as bonding material 330. As a result, only a very thin bond line 332 (e.g., 1-10 µm) of bonding material 330 between MEMS die 120 and substrate 105 may be formed. Moreover, a rather large fillet 334 of bonding material 330 that climbs the edges of legs 124 may be formed. This thin bond line 332 as shown in FIG. 3A results in a weak bond between MEMS die 120 and substrate 105, thereby causing various problems associated with the microphone assembly as described in more detail below.

Figure 3B:
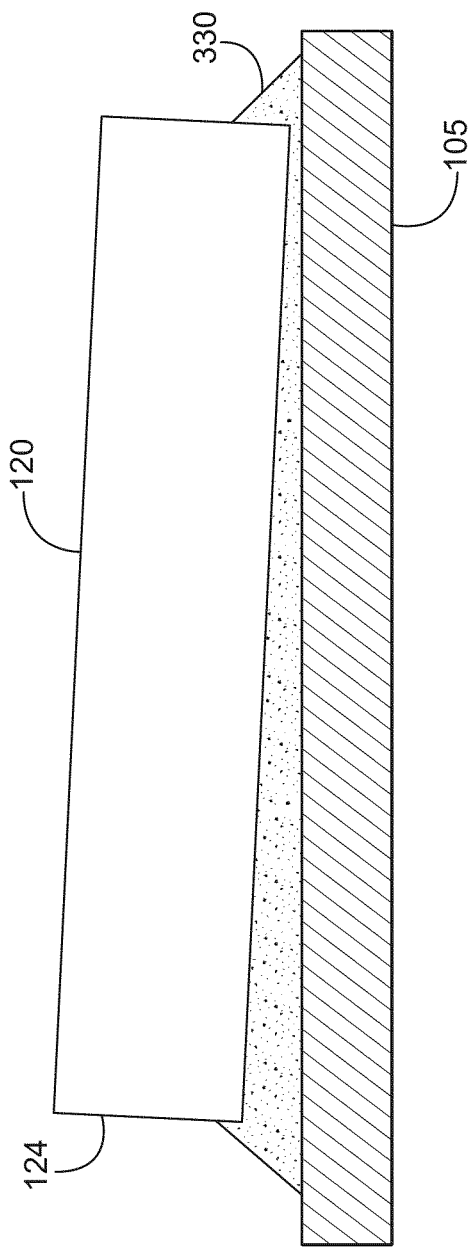
FIG. 3B shows a side view of a MEMS die bonded to a substrate of a microphone assembly without standoffs, according to some embodiments.

Referring now to FIG. 3B, a side view of MEMS die 120 when attached to substrate 105 via bonding material 330 without standoffs is shown, according to some embodiments. As shown, MEMS die 120 may be tilted if it is not supported during the fabrication process. This tilt often results if a large quantity of bonding material 330 is used in an effort to achieve a thicker bond line. Moreover, if a weak bond between MEMS die 120 and substrate 105 is formed, MEMS die 120 may be tilted as a result of force exerted during the wire bonding process. The wire bonding process can include formation of a ball bond on a bond pad of MEMS die 120 used to electrically connect MEMS die 120 to integrated circuit 125 (e.g., wire bonds 130). The wire bonding process can exert a significant amount of force on MEMS die 120. If the bond between MEMS die 120 and substrate 105 is not strong enough, this wire bonding process can result in movement of MEMS die 120. In the case where MEMS die 120 is bonded to ingress protection element 150 instead of substrate 105, similar challenges are faced as described above with respect to FIGS. 3A and 3B. While this tilt is accentuated in FIG. 3B for the purpose of more clearly illustrating the problem, even a slight tilt can have adverse effects on the microphone.

Figure 4A:
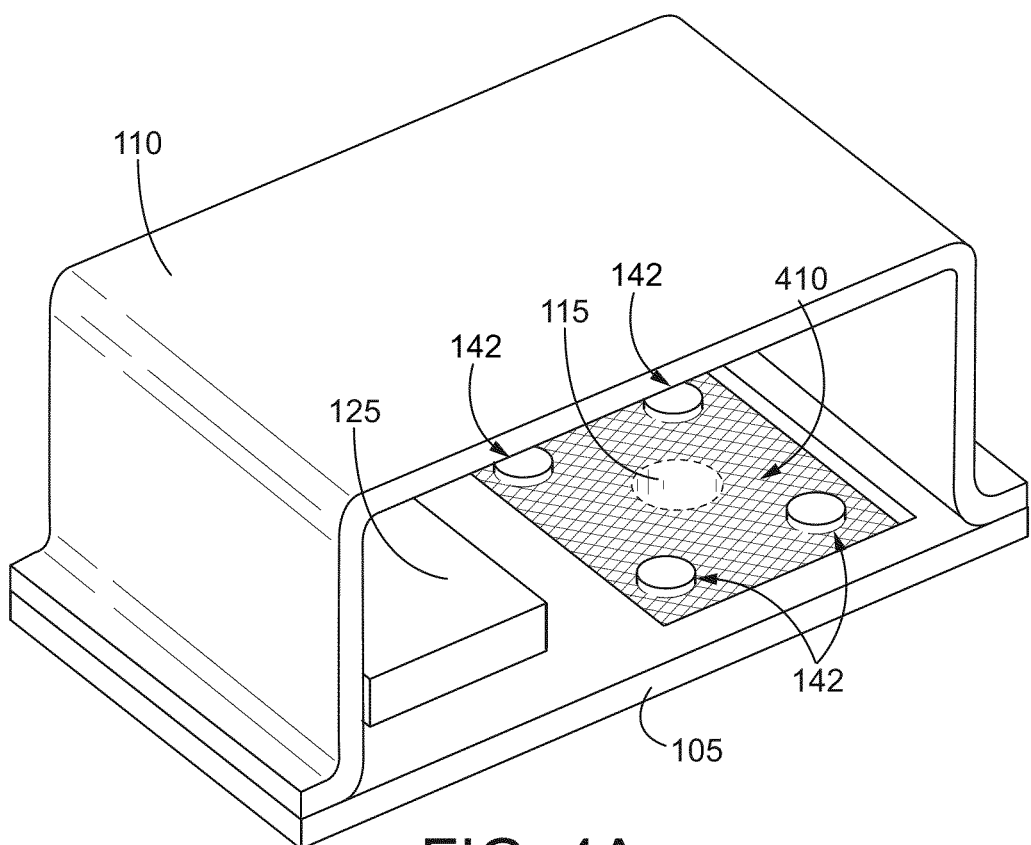
FIG. 4A shows a top view of a substrate of a microphone assembly comprising solder mask standoffs for attaching a MEMS die, according to some embodiments.

Turning now to FIG. 4A, a drawing of substrate 105 with standoffs 142 is shown, according to some embodiments. As mentioned, in some embodiments, standoffs 142 are formed of solder mask material as part of a top layer of substrate 105 as shown in FIG. 4A. For example, the top surface of substrate 105 can include a layer of solder mask material disposed over layers of conductive, insulating, and epoxy materials. Standoffs 142 can be formed within this top layer of solder mask and thus can be readily manufactured. A design of substrate 105 can be created using computer software and this design can be used as a blueprint when substrate 105 is manufactured. The design process generally involves developing a layout of substrate 105 that designates areas where solder mask should be applied (e.g., to prevent oxidation and formation of solder bridges). As such, standoffs 142 can be designed into substrate 105 such that standoffs 142 are part of substrate 105 and do not need to be dispensed or otherwise formed on substrate 105 during fabrication of the microphone assembly. As shown in FIG. 4A, standoffs 142 can be applied over a pre-impregnated ("pre-preg") portion 410 of substrate 105 (e.g., lightweight composite layer) that is exposed as a result of a surface curing process. However, standoffs 142 can also be formed over other materials or layers of substrate 105 that serve as the die pad during the die bonding process. As shown in FIG. 4A, acoustic port 115 is formed in the center of standoffs 142.

Figure 4B:
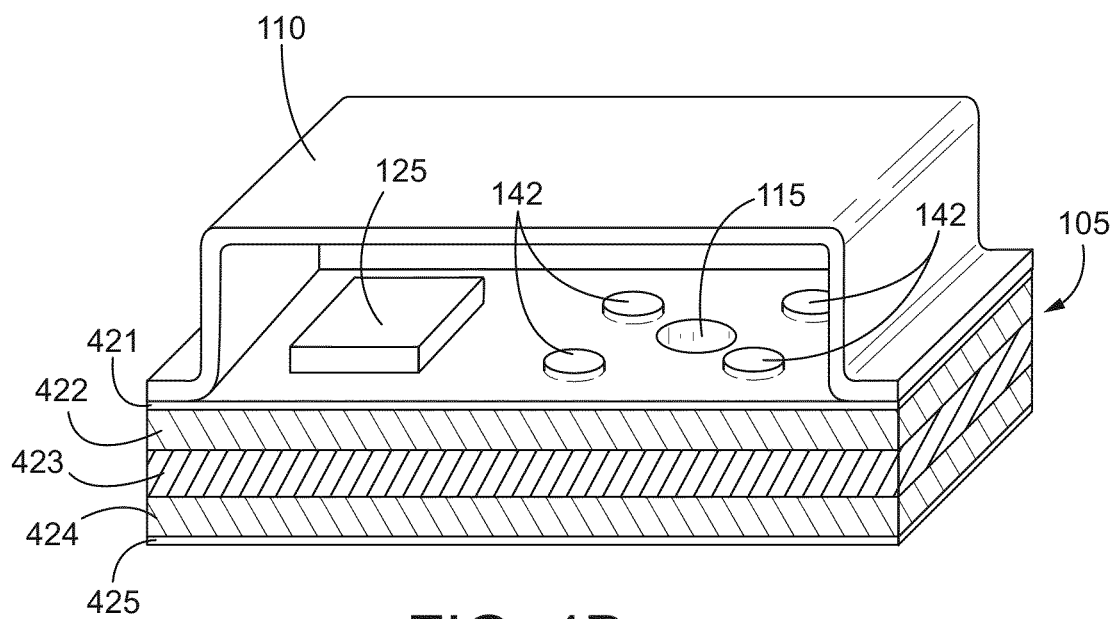
FIG. 4B shows a side view of a substrate of a microphone assembly comprising solder mask standoffs for attaching a MEMS die, according to some embodiments.

Turning now to FIG. 4B, another drawing of substrate 105 with standoffs 142 is shown, according to some embodiments. FIG. 4B shows an example implementation of substrate 105 as a layered printed circuit board. As shown, substrate 105 includes a top layer 421 of solder mask material disposed over a second layer 422 of copper or another conductive material. Substrate 105 is also shown to include an insulating layer 423, a second conductive layer 424, and a bottom layer of solder mask material 425. It should be noted that the configuration shown is intended to be exemplary and variations thereof are contemplated within the scope of the present disclosure. For example, substrate 105 may also include vias and other connection paths in addition to a ground plane, a power plane, and connection pads formed on the bottom surface of layer 425. Substrate 105 can also include pre-preg layers such as described above. In the illustrated embodiment of FIG. 4B, standoffs 142 are formed as part of the top layer of solder mask 421.

Figure 4C:
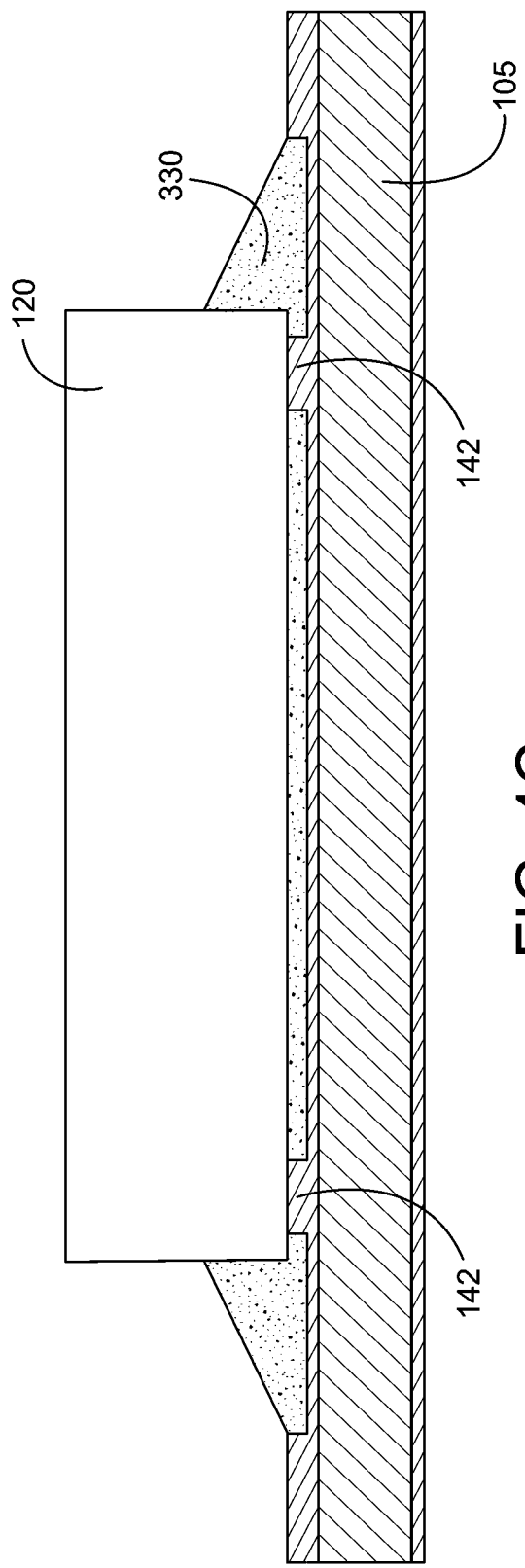
FIG. 4C shows a MEMS die bonded to a substrate of a microphone assembly that includes solder mask standoffs for attaching the MEMS die, according to some embodiments.

Turning now to FIG. 4C, a drawing of MEMS die 120 when bonded to substrate 105 via standoffs 142 is shown, according to some embodiments. During the die bonding process, bonding material 330 can be dispensed over standoffs 142 and within pre-preg portion 410, for example. Next, MEMS die 120 can be disposed on standoffs 142 such that legs 124 of MEMS die 120 do not sink into bonding material 330 because they are supported by standoffs 142. As a result, a much thicker bond line between MEMS die 120 and substrate 105 can be achieved. Moreover, standoffs 142 can be designed such that they have identical or nearly identical geometries. Accordingly, a much more consistent bond line between MEMS die 120 and substrate 105 can also be achieved. As shown in FIG. 4C, MEMS die 120 rests evenly on standoffs 142 such that the bond line is of approximately equal thickness along the length of legs 124, and MEMS die 120 is not tilted. In some embodiments, a bond line of about 30-60 μm can be achieved even when using a soft die attach material. In addition, only about a 1 μm bond line between standoffs 412 and MEMS die 120 may result and the fillet may not overly large as shown in FIG. 3A when standoffs 142 are not used. Standoffs 142 facilitate the formation of a strong and even bond between MEMS die 120 and substrate 105. Similar results can be achieved in the case where standoffs 152 are formed as part of barrier element 150.

Figure 4D:
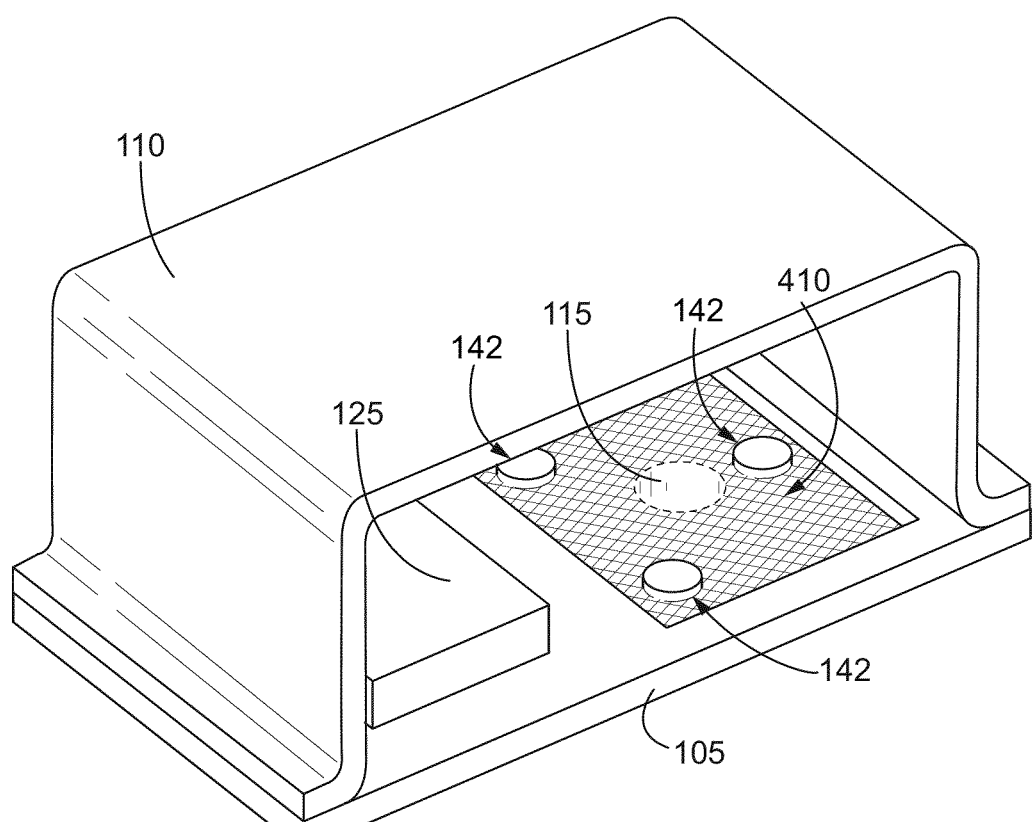
FIG. 4D shows another side view of a substrate of a microphone assembly comprising solder mask standoffs for attaching a MEMS die, according to some embodiments.
Figure 4E:
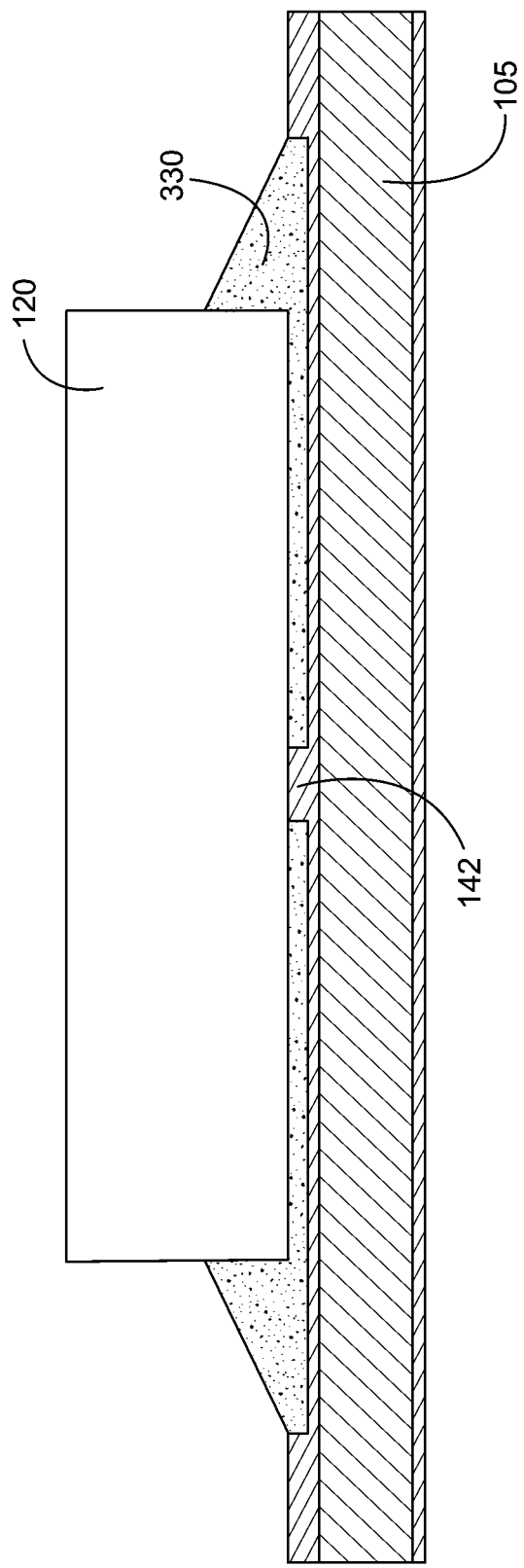
FIG. 4E shows another MEMS die bonded to a substrate of a microphone assembly that includes solder mask standoffs for attaching the MEMS die, according to some embodiments.

Turning now to FIG. 4D, another drawing of substrate 105 with standoffs 142 is shown, according to some embodiments. In FIG. 4D, a total of three standoffs 142 are used to support MEMS die 120 instead of four standoffs 142 as shown in FIG. 4A. Notably, in FIG. 4D, two standoffs 142 are formed on the side closest to integrated circuit 125, and one standoff 142 is formed on the opposing side near the cover 110. The use of the two standoffs 142 on the side closest to integrated circuit 125 may be advantageous in supporting MEMS die 120 during the wire bonding process (e.g., formation of wire bonds 130). The three standoffs 142 may be arranged in approximately a triangle shape, with the acoustic port 115 at or near the center of the triangle shape. Turning to FIG. 4E, another drawing of MEMS die 120 when bonded to substrate 105 via standoffs 142 is shown, according to some embodiments. FIG. 4E provides a view of MEMS die 120 on a side where only one standoff 142 is used, such as on the side closest to cover 110 in FIG. 4D. The one standoff 142 may be sufficient to support MEMS die 120 since no wire bonding occurs on such a side of MEMS die 120. Accordingly, one or more of cost savings, ease of fabrication, and design simplifications may be achieved by using only one standoff 142 instead of two standoffs 142 on the side of MEMS die 120 that is opposite integrated circuit 125.

Figure 4F:
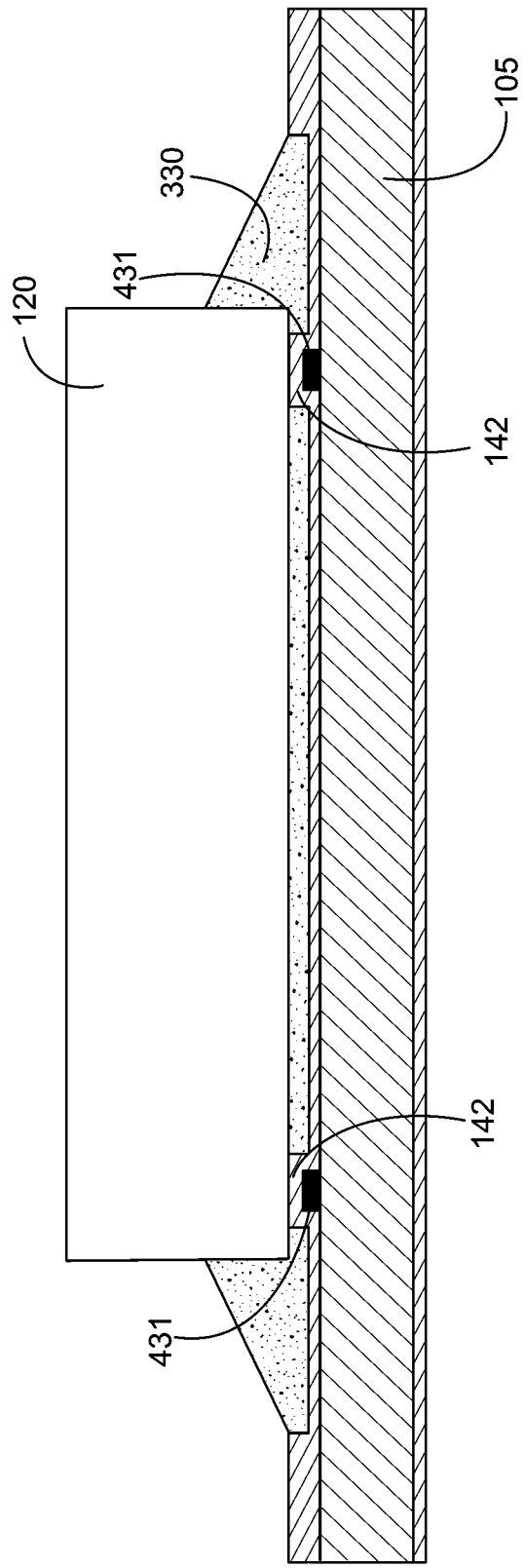
FIG. 4F shows yet another MEMS die bonded to a substrate of a microphone assembly that includes solder mask standoffs for attaching the MEMS die, according to some embodiments.
Figure 4G:
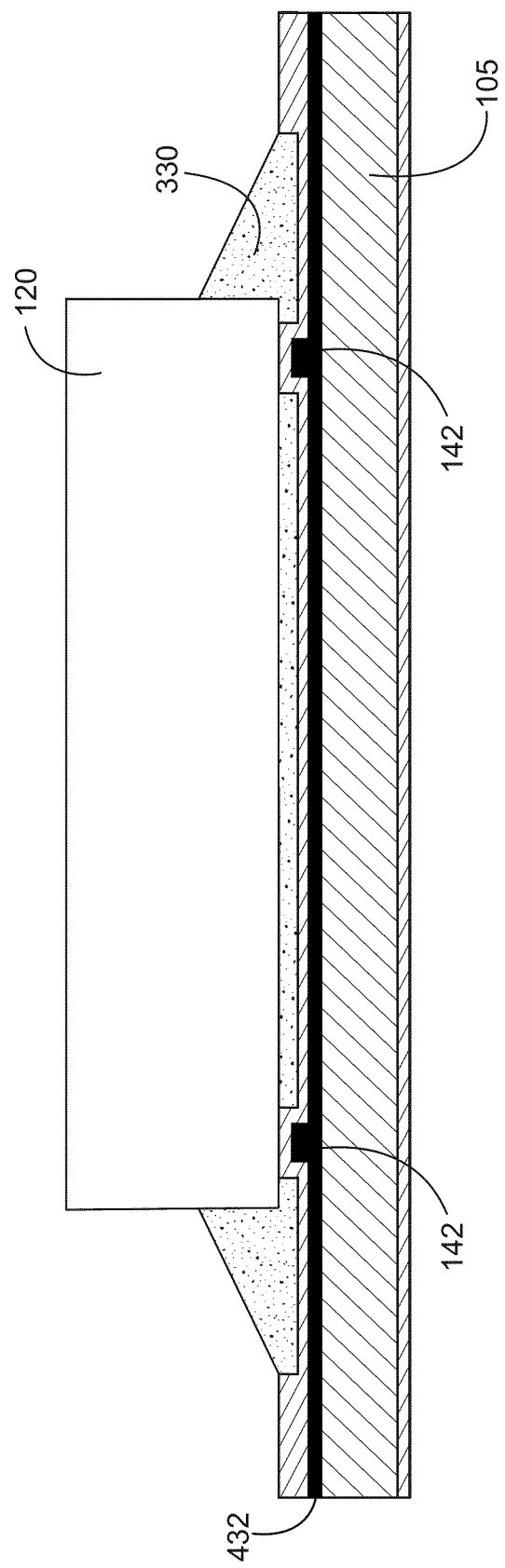
FIG. 4G shows yet another MEMS die bonded to a substrate of a microphone assembly that includes solder mask standoffs for attaching the MEMS die, according to some embodiments.
Figure 4H:
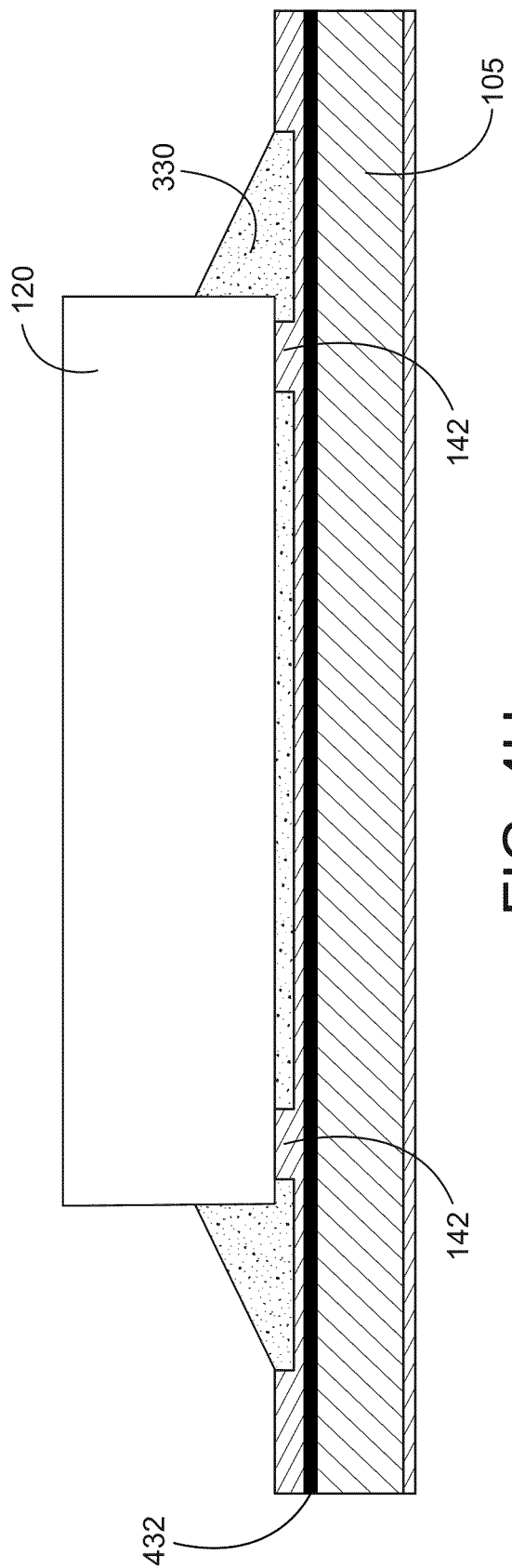
FIG. 4H shows yet another MEMS die bonded to a substrate of a microphone assembly that includes solder mask standoffs for attaching the MEMS die, according to some embodiments.

Turning now to FIGS. 4F-4H, additional drawings of MEMS die 120 when bonded to substrate 105 via standoffs 142 are shown, according to some embodiments. In FIG. 4F, metal posts 431 are added underneath the solder mask. Metal posts 431 may be formed of copper or another similar metal material. Metal posts 431 may be isolated from any other metal materials within base 105 and may facilitate improved performance with respect to adhesion and testing visualization. For example, metal posts 431 may facilitate formation of a stronger bond between MEMS die 120 and base 105. Metal posts 431 may also assist with imaging during and after the fabrication process. Further, in some examples, in the absence of metal posts 431, solder mask may be applied unevenly to the top surface of base 105. As a result, standoffs 142 may end up being different sizes and shapes, thereby leading to misalignment of MEMS die 120 within microphone assembly 100. However, use of metal posts 431 can provide more even and consistent distribution of solder mask. In some examples, only a very thin layer of solder mask is applied over metal posts 431 to form standoffs 142, thereby reducing variability in the fabrication process. In FIG. 4G, a metal layer 432 is added underneath the solder mask. As shown in FIG. 4G, metal layer 432 includes elevated portions formed underneath standoffs 142 (similar to metal posts 431 in FIG. 4F). In FIG. 4H, metal layer 432 does not include the elevated portions underneath standoffs 142 as shown in FIG. 4G. Metal posts 431 and metal layer 432 may be implemented in a variety of ways (e.g., various size, thickness, etc.) to facilitate improved performance with respect to adhesion and testing visualization in different applications.

Turning now to FIG. 5A, a drawing of standoffs 152 formed as part of barrier element 150 is shown, according to some embodiments. In the case of microphone assemblies such as microphone 200, MEMS die 120 is bonded to ingress protection element 150 instead of substrate 105. In such embodiments, standoffs 152 are formed of a same material as ingress protection element 150 (e.g., mesh membrane or particle barrier). For example, ingress protection element 150 can be formed by spin coating a polyimide (PI) material on a top surface of substrate 105. The spin coating process can include depositing polyimide on the top surface of substrate 105 over acoustic port 115 and rotating substrate 105 at a high speed such that a centrifugal force causes the polyimide to thin and spread out on the top surface of substrate 105. Next, a photolithographic process can be used to pattern the polyimide material into a mesh-like structure such that ingress protection element 150 can prevent ingress of contaminants (e.g., dust and other particles) without introducing a significant acoustic impedance. During the photolithographic process, standoffs 152 can be patterned into ingress protection element 150 to support MEMS die 120 during bonding.

Turning now to FIG. 5B, a side view of the example drawing of FIG. 5A is shown, according to some embodiments. FIG. 5B shows that ingress protection element 150 is disposed over acoustic port 115 and standoffs 152 are fabricated as part of ingress protection element 150, according to some embodiments. As shown in both FIGS. 5A and 5B, standoffs 152 can be formed such that they have identical or nearly identical geometries. During the die bonding process, bonding material 330 can be dispensed over standoffs 152 and at least part of ingress protection element 150 before MEMS die 120 is disposed on standoffs 152. Next, bonding material 330 can be cured such that a thick and consistent bond line between MEMS die 120 and ingress protection element 150 is formed.

Figure 5C:
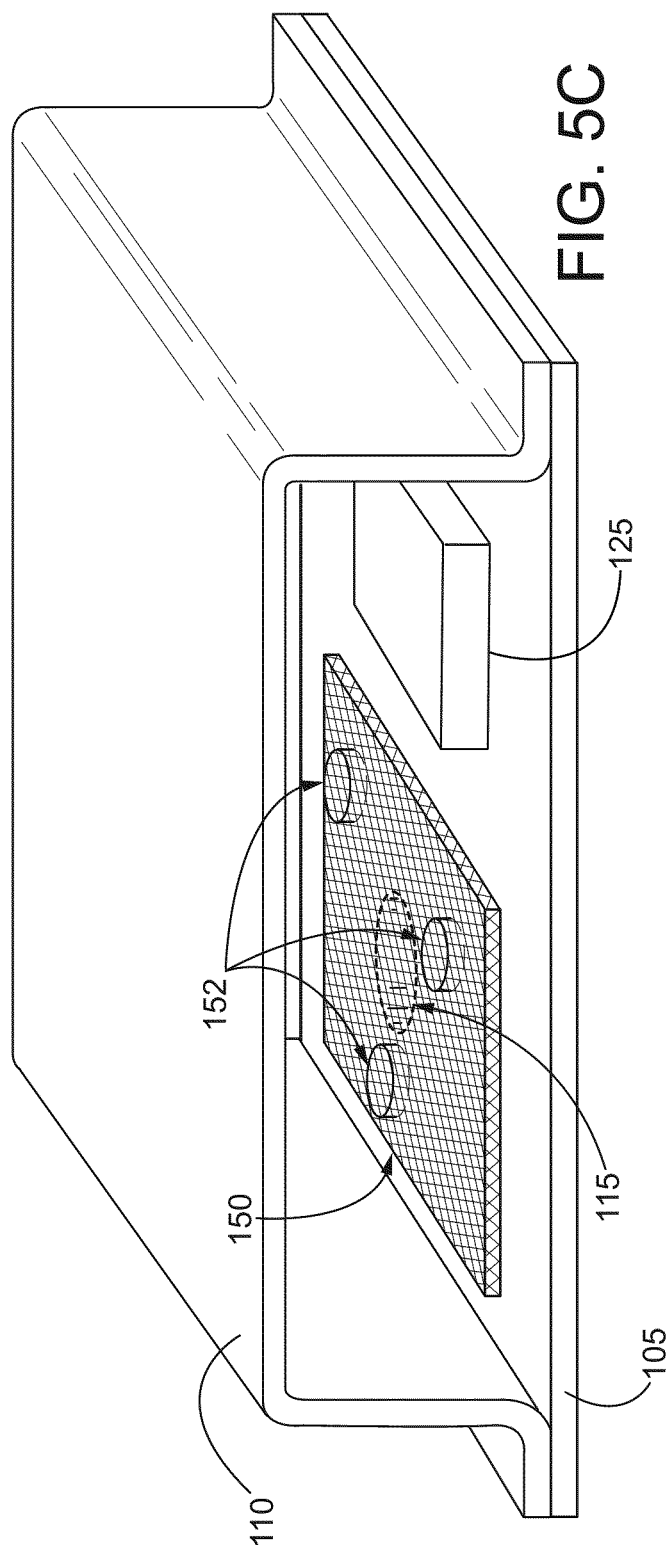
FIG. 5C shows a side view of an ingress protection element disposed on a top surface of a substrate of a microphone assembly and comprising standoffs formed of ingress protection material, according to some embodiments.

Turning now to FIG. 5C, another drawing of standoffs 152 formed as part of barrier element 150 is shown, according to some embodiments. In FIG. 5C, a total of three standoffs 152 are used to support MEMS die 120 instead of four standoffs 152 as shown in FIG. 5A. Notably, in FIG. 5C, two standoffs 152 are formed on the side closest to integrated circuit 125, and one standoff 152 is formed on the opposing side near the cover 110. The use of the two standoffs 152 on the side closest to the integrated circuit 125 may be advantageous in supporting MEMS die 120 during the wire bonding process (e.g., formation of wire bonds 130). The three standoffs 152 may be arranged in approximately a triangle shape, with the acoustic port 115 at or near the center of the triangle shape. Turning to FIG. 4E, another drawing of MEMS die 120 when bonded to substrate 105 via standoffs 142 is shown, according to some embodiments. The one standoff 152 may be sufficient to support MEMS die 120 on the side opposite integrated circuit 125 since no wire bonding occurs on this side of MEMS die 120. As such, one or more of cost savings, ease of fabrication, and design simplifications may be achieved by using only one standoff 152 instead of two standoffs 152 on the side of MEMS die 120 that is opposite integrated circuit 125.

Alternative approaches can involve forming standoffs by printing or otherwise dispensing epoxy or solder onto the substrate during fabrication of the microphone assembly. Alternative approaches also can involve forming standoffs of printed epoxy or of other materials that are pre-manufactured before attachment to the substrate (i.e., they are not part of the substrate). However, forming the standoffs using these approaches can be much more complicated (e.g., more steps in fabrication process) than forming standoffs of solder mask material or of ingress protection material and can cause undesirable results. For example, if multiple standoffs are dispensed or printed onto the substrate during fabrication, typically the standoffs will be uneven (i.e., different sizes) due to variability in the dispensing or printing process. For example, the printer or dispensing instrument typically needs to be cleaned, and a "dirty" printer or dispensing instrument can cause inconsistent formation of standoffs. Moreover, the presence of small voltages near the substrate during the dispensing or printing process can introduce additional variation and inconsistency. In the case of printed epoxy standoffs, the standoffs can "slump" or otherwise deform during the fabrication process and/or during the lifetime of the microphone assembly. As such, a relatively inconsistent and thin bond line between the MEMS die and the substrate may be formed, thereby resulting in a weak die bond and/or a tilted MEMS die. Accordingly, performance of these previous microphone assemblies may suffer.

Standoffs 142 and 152 provide one or more of several advantages for bonding a MEMS microphone die to a substrate or ingress protection element of a microphone assembly. As mentioned above, the geometry of the microphone die (e.g., cavity 122 and resulting legs 124) can present various challenges during fabrication of the microphone assembly. Standoffs 142 and 152 support the MEMS die during the bonding process, thereby delivering increased bond line thickness and improved bond line consistency. This thicker and more consistent bond line drives improved stress isolation of various components of the microphone assembly including MEMS die 120 itself as well as integrated circuit 125. For example, as mentioned above, after MEMS die 120 is bonded to substrate 105, wire bonds (e.g., wire bonds 130) can be formed to electrically connect MEMS die 120 and integrated circuit 125. This wire bonding process can exert significant force on MEMS die 120 such that MEMS die 120 "bounces" or otherwise moves if the bond between MEMS die 120 and substrate 105 is not strong enough. Moreover, if the microphone assembly experiences significant vibration (e.g., when host device is dropped), MEMS die 120 can shift if the bond between MEMS die 120 and substrate 105 is not strong enough. In this case, since MEMS die 120 is wire bonded to integrated circuit 125, movement of MEMS die 120 can also cause movement of integrated circuit 125. Standoffs 142 and 152 facilitate the formation a thick and consistent bond line such that the bond between MEMS die 120 and substrate 105 or ingress protection element 150 is strong and flexible enough to prevent such movements.

Standoffs 142 and 152 can also facilitate increased sensitivity and performance of a microphone assembly. The stronger and more consistent die bond provides a better acoustic seal and ensures that MEMS die 120 is positioned properly within the microphone assembly, thereby providing a microphone with improved sensitivity and performance when compared to microphones with weaker and more inconsistent die bonds. In some embodiments, the microphone assembly achieves about a 10% increase in sensitivity when standoffs 142 are formed as part of substrate 105 or standoffs 152 are formed as part of ingress protection element 150. Moreover, standoffs 142 and 152 can improve the manufacturability of various components of the microphone assembly. For example, the shape and performance of wire bonds 130 can be improved (e.g., easier to form, consistent shape, not "smashed") due to the stronger bond made possible by standoffs 142 and 152. The improved stability of MEMS die 120 during the wire bonding process can result in better wire bonds. Accordingly, one or more undesirable effects such as wire bonds 130 not sticking to bond pads, low bond shear, and bond connection open failures can be avoided. Given the size and intricacy of modern electronic components (e.g., microphone 100 may be as small as 3 mm×3 mm×1 mm), these advantages can be very significant.

While the embodiments described herein generally include four standoffs formed in a square shape around acoustic port 115 or three standoffs formed in a triangle shape around acoustic port, it should be noted that a variety of quantities and configurations of standoffs 142 and 152 are possible and contemplated within the scope of the present disclosure. Acoustic port 115 may be located proximate to a center of the square shape or proximate to a center of the triangle shape, such as within 10% of a length of an edge of the square shape from the center of the square shape or within 10% of a length of an edge of the triangle shape from the center of the triangle shape. Moreover, since standoffs 142 are part of substrate 105 and standoffs 152 are part of ingress protection element 150, the size and shape of the standoffs are customizable for a variety of different applications. In some embodiments, the standoffs 142 (and the standoffs 152) are about 150 microns in diameter, and the bond line thickness between MEMS die 120 and substrate 105 (and between MEMS die 120 and ingress protection element 150) is about 45 microns +/−15, for a range of about 30-60 microns. However, in other applications greater or less clearance between MEMS die 120 and substrate 105 or ingress protection element 150 may be desired. In such applications, the height and/or shape of standoffs 142 or 152 can be adjusted to achieve the desired design specifications. Moreover, while the present disclosure describes a microphone assembly in detail, it will be appreciated that the approaches described herein are applicable to a variety of electronic components.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microphone assembly comprising:
   a substrate comprising a top layer and a bottom layer, the top layer comprising a layer of solder mask material spanning across at least a portion of the substrate and one or more standoffs formed of the solder mask material, the one or more standoffs and the layer of solder mask material comprising a single, contiguous structure; and
   a microelectromechanical system (MEMS) die disposed on the one or more standoffs and coupled to the substrate via a bonding material, wherein the bonding material forms an acoustic seal between the substrate and the MEMS die.

2. The microphone assembly of claim 1, wherein a thickness of a bond line comprising the bonding material between the substrate and the MEMS die is between 30 microns and 60 microns.

3. The microphone assembly of claim 1, wherein the one or more standoffs comprises four standoffs in a square shape with an acoustic port of the microphone assembly proximate to a center of the square shape.

4. The microphone assembly of claim 1, wherein the one or more standoffs comprises three standoffs in a triangle shape with an acoustic port of the microphone assembly proximate to a center of the triangle shape.

5. The microphone assembly of claim 1, wherein the one or more standoffs have substantially identical geometries.

6. The microphone assembly of claim 1, wherein the MEMS die comprises a diaphragm and a backplate, and wherein the bonding material is epoxy, the microphone assembly further comprising:
   a cover coupled to the substrate;
   an acoustic port disposed in the substrate or the cover; and
   an integrated circuit coupled to the MEMS die via one or more wire bonds.

7. The microphone assembly of claim 1, wherein a diameter of at least one of the one or more standoffs is between 140 microns and 160 microns.

8. The microphone assembly of claim 1,
   wherein the one or more standoffs comprises three standoffs in a triangle shape with an acoustic port of the microphone assembly proximate to a center of the triangle shape, and
   wherein the triangle shape comprises two standoffs supporting a first side of the MEMS die closest to an integrated circuit of the microphone assembly, and one standoff supporting a second side of the MEMS die opposite the first side.

9. The microphone assembly of claim 1, further comprising a metal post disposed beneath each of the one or more standoffs.

10. A microphone assembly comprising:
a substrate comprising a top surface and a bottom surface;
a cover coupled to the top surface of the substrate;
an acoustic port formed in the substrate;
an ingress protection element comprising a top surface and a bottom surface, the bottom surface of the ingress protection element coupled to the top surface of the substrate and spanning across the acoustic port, the top surface of the ingress protection element comprising one or more standoffs, the one or more standoffs and the ingress protection element comprising a single, contiguous structure;
a microelectromechanical system (MEMS) die disposed on the one or more standoffs and coupled to the ingress protection element via a bonding material, wherein the bonding material forms an acoustic seal between the ingress protection element and the MEMS die.

11. The microphone assembly of claim 10, wherein the ingress protection element comprises a mesh.

12. The microphone assembly of claim 11, wherein the mesh comprises a polyimide material.

13. The microphone assembly of claim 10, wherein the one or more standoffs comprises four standoffs in a square shape with an acoustic port of the microphone assembly proximate to a center of the square shape.

14. The microphone assembly of claim 10, wherein a thickness of a bond line comprising the bonding material between the ingress protection element and the MEMS die is between 30 microns and 60 microns.

15. The microphone assembly of claim 10, wherein the one or more standoffs have substantially identical geometries.

16. The microphone assembly of claim 10, wherein the one or more standoffs comprises three standoffs in a triangle shape with an acoustic port of the microphone assembly proximate to a center of the triangle shape.

17. The microphone assembly of claim 10, wherein the MEMS die comprises a diaphragm and a backplate, the microphone assembly further comprising an integrated circuit coupled to the MEMS die via one or more wire bonds.

18. A microphone assembly comprising:
a substrate comprising a top layer and a bottom layer, the top layer comprising a layer of solder mask material spanning across at least a portion of the substrate and at least three standoffs formed of the solder mask material, the at least three standoffs and the layer of solder mask material comprising a single, contiguous structure;
a cover coupled to the top layer of the substrate;
an acoustic port formed in the substrate or formed in the cover; and
a microelectromechanical system (MEMS) die disposed on the at least three standoffs and coupled to the substrate via a bonding material, wherein the bonding material forms an acoustic seal between the substrate and the MEMS die.

19. The microphone assembly of claim 18, wherein a thickness of a bond line comprising the bonding material between the substrate and the MEMS die is between 30 microns and 60 microns.

20. The microphone assembly of claim 18, wherein the at least three standoffs comprise three standoffs in a triangle shape with an acoustic port of the microphone assembly proximate to a center of the triangle shape.

* * * * *